United States Patent
Murray et al.

(10) Patent No.: US 10,303,220 B1
(45) Date of Patent: May 28, 2019

(54) TACTICAL DATA CENTER SYSTEM

(71) Applicant: KLAS TECHNOLOGIES LIMITED, Dublin (IE)

(72) Inventors: Frank Murray, Dublin (IE); Mark Ryan, Dublin (IE); Enda Sullivan, Dublin (IE)

(73) Assignee: KLAS TECHNOLOGIES LIMITED, Dublin (IE)

( * ) Notice: Subject to any disclaimer, the term of this patent is extended or adjusted under 35 U.S.C. 154(b) by 0 days.

(21) Appl. No.: 15/928,593

(22) Filed: Mar. 22, 2018

Related U.S. Application Data (63) Continuation of application No. 15/850,695, filed on Dec. 21, 2017.

(51) Int. Cl.
  *G06F 1/16* (2006.01)
  *H05K 7/20* (2006.01)
  *H05K 7/14* (2006.01)

(52) U.S. Cl.
  CPC .......... *G06F 1/1658* (2013.01); *G06F 1/1624* (2013.01); *H05K 7/1487* (2013.01); *H05K 7/1489* (2013.01); *H05K 7/20136* (2013.01)

(58) Field of Classification Search
  CPC .. H05K 7/1487; H05K 7/1488; H05K 7/1489; G06F 1/181–1/188
  See application file for complete search history.

(56) References Cited

U.S. PATENT DOCUMENTS

| | | | | | |
|---|---|---|---|---|---|
| 5,160,357 | A | * | 11/1992 | Faber | H05K 7/1424 220/4.02 |
| 5,461,717 | A | * | 10/1995 | Notarianni | G06F 1/1632 361/727 |
| 5,808,866 | A | * | 9/1998 | Porter | H05K 7/1424 174/377 |
| 6,003,068 | A | * | 12/1999 | Sopko | G06F 1/1613 709/203 |
| 6,324,062 | B1 | * | 11/2001 | Treiber | G06F 1/181 312/223.2 |

(Continued)

*Primary Examiner* — Anthony Q Edwards
(74) *Attorney, Agent, or Firm* — Vorys, Sater, Seymour and Pease LLP (57) ABSTRACT

A portable computing system includes a transit case for providing structure for the mobile computing system, and has a power supply for providing power to the portable computing system. The portable computing system further includes a slidably removable sled disposed inside the transit case, configured to hold a plurality of computing components and to enable access to the plurality of computing components. The slidable removable sled includes a top chamber configured to hold a first type of computing device; a bottom chamber configured to hold a second type of computing device; and a floor disposed between the top chamber and a bottom chamber. The portable computing system further includes a switch, disposed in the bottom chamber, to provide computer networking and communications functions. The portable computing system further includes a plurality of computing blades, disposed in the top chamber, to provide computing capabilities, wherein each of the plurality of computing blades comprises a central processing unit ("CPU") comprising a software multiplexer for interfacing directly with a plurality of solid state drives ("SSDs").

18 Claims, 7 Drawing Sheets

(56) References Cited

U.S. PATENT DOCUMENTS

| | | | | |
|---|---|---|---|---|
| 6,499,609 B2* | 12/2002 | Patriche | ............... | G02B 6/4455 |
| | | | | 211/175 |
| 6,585,090 B2* | 7/2003 | Harvey | ................... | A45C 5/04 |
| | | | | 190/108 |
| 7,242,589 B1* | 7/2007 | Cheng | ................. | H05K 5/0021 |
| | | | | 361/735 |
| 7,535,861 B2* | 5/2009 | Buchholz | ............... | H04W 84/10 |
| | | | | 370/310 |
| 7,573,713 B2* | 8/2009 | Hoffman | ............ | H05K 7/20136 |
| | | | | 165/80.3 |
| 7,688,584 B1* | 3/2010 | Becklin | .................. | H05K 7/202 |
| | | | | 165/104.33 |
| 7,817,589 B2* | 10/2010 | Hoffmann | ............. | H04W 84/10 |
| | | | | 370/310 |
| 8,411,446 B2* | 4/2013 | Becklin | ................ | H05K 7/1421 |
| | | | | 206/594 |
| 8,424,885 B2* | 4/2013 | Woodbury, II | ........ | B62B 5/0026 |
| | | | | 280/47.34 |
| 8,668,285 B2* | 3/2014 | Becklin | ................ | H05K 7/1424 |
| | | | | 108/143 |
| 8,670,241 B2* | 3/2014 | Sherrod | ............... | H05K 7/1492 |
| | | | | 361/725 |
| 9,842,075 B1* | 12/2017 | Davis | .................. | G06F 13/105 |
| 2005/0199459 A1* | 9/2005 | Harvey | ................... | A45C 5/14 |
| | | | | 190/108 |
| 2006/0071581 A1* | 4/2006 | Harvey | ................ | H05K 5/0021 |
| | | | | 312/240 |
| 2009/0083445 A1* | 3/2009 | Ganga | ..................... | G06F 15/16 |
| | | | | 709/250 |
| 2015/0173235 A1* | 6/2015 | Ma | ........................ | H05K 7/1489 |
| | | | | 361/679.58 |
| 2016/0073544 A1* | 3/2016 | Heyd | ................... | G11B 33/128 |
| | | | | 361/679.31 |

* cited by examiner

TACTICAL DATA CENTER SYSTEM

BACKGROUND

Computing systems and networks, including communications networks, and data storage networks, are often relied on by individuals, teams, and organizations for a variety of applications. For example, computing system or a communication network may be relied on by military personnel while carrying on field operations. In addition, such networks and computing systems may be relied on in a variety of settings. For example, a communication network may be needed by military personal in the middle of a desert.

Existing computing systems and networks, however, may not have the portability and flexibility needed for serving such a variety of applications in a variety of settings. For example, existing computing systems and networks may include several components such as network switches and multiple computers with processing, data storage, and communication capabilities. Transporting such equipment for various types of field operations may be time consuming, very costly and impractical, due to size, weight, and power constraints. In addition, processing and storage capabilities of such systems may be limited due to portability requirements.

Moreover, existing storage networks may rely on a host bus adapter (or a hardware multiplexer) to interface a CPU with multiple solid state drives in order to expand storage capabilities. However, the hardware multiplexer requires additional power resources and also takes up physical space, both of which may be limited in a portable mobile deployment.

SUMMARY

A portable computing system includes a transit case for providing structure for the mobile computing system, and has a power supply for providing power to the portable computing system. The portable computing system further includes a slidably removable sled disposed inside the transit case, configured to hold a plurality of computing components and to enable access to the plurality of computing components and externally connected devices. The slidable removable sled includes a top chamber configured to hold a first type of computing device; a bottom chamber configured to hold a second type of computing device; and a floor disposed between the top chamber and a bottom chamber. The portable computing system further includes a switch, disposed in the bottom chamber, to provide computer networking and communications functions. The portable computing system further includes a plurality of computing blades, disposed in the top chamber, to provide computing capabilities, wherein each of the plurality of computing blades comprises a central processing unit ("CPU") comprising a software multiplexer for interfacing directly with a plurality of solid state drives ("SSDs").

BRIEF DESCRIPTION OF THE DRAWINGS

In the accompanying drawings, structures are illustrated that, together with the detailed description provided below, describe exemplary embodiments of the claimed invention. Like elements are identified with the same reference numerals. It should be understood that elements shown as a single component may be replaced with multiple components, and elements shown as multiple components may be replaced with a single component. The drawings are not to scale and the proportion of certain elements may be exaggerated for the purpose of illustration.

DETAILED DESCRIPTION

Figure 1:
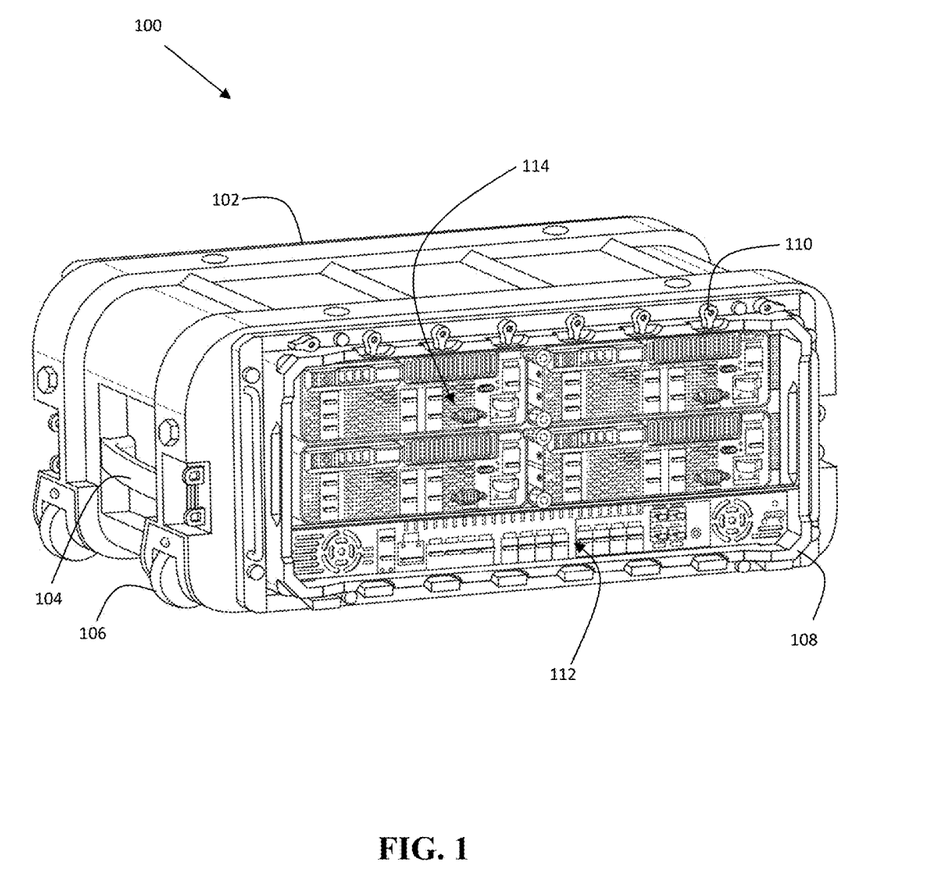
FIG. 1 illustrates an example Tactical Data Center ("TDC") System.

FIG. 1 illustrates an example Tactical Data Center ("TDC") System 100 for enabling deployment of enterprise-grade, hyperconverged tactical data storage networks in a modular, portable, and flexible configuration. The TDC system 100 enables communication, computing, and collection, storage, replication, and mirroring of large volumes of data, such as mapping and imagery files, while reducing power and space requirements and alleviating communication bandwidth and power constraints.

The TDC system 100 includes a transit case 102 which serves as the chassis for providing overall structure, support, and protection for internal components. It should be appreciated that the transit case 102 may be made of suitable material for providing protection for internal components. In one example, the transit case 102 is constructed from carbon fiber and lightweight aluminum.

The transit case 102 further facilitates easy and efficient transport. For example, the transit case 102 includes a retractable extension handle 104. In combination with wheels 106, an operator is able to easily transport the TDC system 100 to a choice destination. It should be appreciated that the retractable extension handle 104 may be located on the opposite side of the transit case 102 to the wheels, opposite to the wheels 106, even though they may be illustrated as being located on the same side.

The transit case 102 further includes an onboard power supply unit (not shown) to provide electrical power to the internal components. Thus, even when working at remote locations where traditional power sources may be unavailable, the components stored inside the transit case 102 may continue to function.

It should be appreciated that, although the TDC system 100 is shown as having a front lid (not shown) of the transit case 102 removed for illustrative purposes, the transit case 102 completely encloses all of the components. It should further be appreciated that either one of or both the front and rear lids (not shown) may be removable to facilitate access to the internal components. In one example, the transit case 102 further includes O-rings (not shown) at both the front and rear in order to facilitate a proper seal at the points of contact for the front and rear lids.

In one example, the transit case 102 may configured to securely stack on top of another. For example, the outer surface of the transit case 102 may be configured with appropriate grooves or protrusions in order to securely engage with grooves or protrusions of a second transit case 102 in order to prevent shifting or sliding when one rests on top of another.

Figure 2:
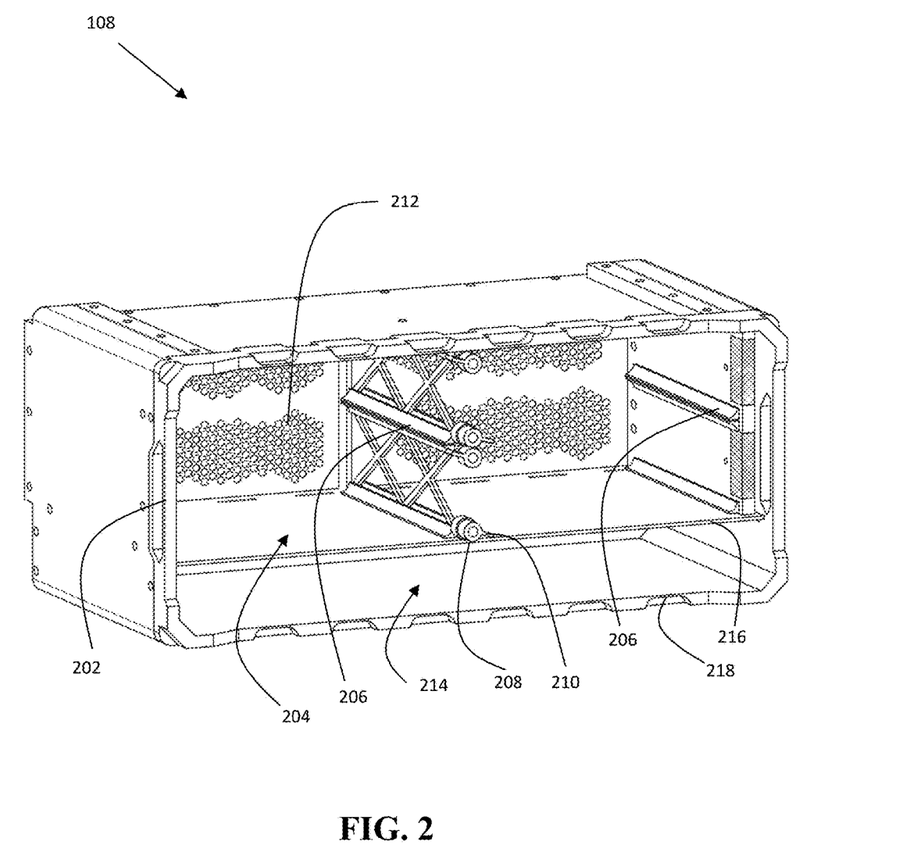
FIG. 2 illustrates an example sled of the TDC of FIG. 1.

The TDC system 100 further includes a sled 108 that fits within the transit case 102 and holds the internal components. The sled 108 is removable by sliding in and out from the transit case 102. Thus, greater access to internal components is enabled as needed, either for maintenance or for operation when a destination point is reached. FIG. 2 illustrates the example sled 108 in more detail. The sled 108 includes handles 202 to facilitate sliding into and out of the transit case 102 more easily. In one example, the sled 108 is configured to be rack mountable within a standard sized component rack, once removed from the transit case 102.

The sled 108 includes a top chamber 204 configured to hold one or more of a first computing component. In particular, the top chamber 204 is configured to hold four of the first computing component; one in the top right of the top chamber 204, one in the bottom right of the top chamber 204, one in the top left of the top chamber 204, and one in bottom left of the top chamber 204. To create these 4 sub-chambers within the top chamber 204, the sled 108 includes dividers 206 or shelves on the sides and in the center in order to provide support for computing components. For example, a left and right divider 206 are located at the center of the right side of the top chamber 204 in order to provide support for a component disposed in the top right of the top chamber 204, a left and right divider 206 are located at the center of the left side of the top chamber 204 in order to provide support for a component disposed in the top left of the top chamber 204, a left and right divider 206 are located at the bottom of the right side of the top chamber 204 in order to provide support for a component disposed in the bottom right of the top chamber 204, and a left and right divider 206 are located at the bottom of the left side of the top chamber 204 in order to provide support for a component disposed in the bottom left of the top chamber 204.

It should be appreciated that, although the example sled 108 illustrates 4 slots in the top chamber 204, the top chamber 108 may be configured with any suitable number of slots.

The sled 108 further includes one or more knobs 208 having a protruding arm 210 located down the center of the top chamber 204 at the one or more dividers 206. The knobs 208 are configured to rotate into a position such that the protruding arms 210 secure the computing components in place after being inserted and prevent them from sliding out from the sled 108.

The sled 108 further includes air vents 212 in the rear of the top chamber 204 to facilitate air circulation and proper cooling of the computing components inserted into the top chamber 204.

The sled 108 further includes a bottom chamber 214 to hold a second type of computing component. A floor 216 separates the top chamber 204 from the bottom chamber 214. It should be appreciated that, although the example sled 108 illustrated is configured bottom chamber 214 that has a height less than the height of the top chamber 204, the sled 108 may be provided with alternative configurations in which the ration of the sizes between the top chamber 204 and the bottom chamber 214 may vary. In one example, the location of the floor 216 and the dividers 206 may be adjustable, thereby facilitating a reconfiguration of the sled 108.

The sled 108 further includes grooves 218 along the top and bottom outer portions. The grooves 218 are configured to facilitate securing of the sled 108 within the transit case 102.

Referring again to FIG. 1, the transit case 102 further includes one or more knobs 110 having a protruding arm located along the top and bottom sides and configured to align with the grooves 218 of the sled 108 such that when the knobs 110 are rotated into proper position, the protruding arms of the knobs 110 engage the grooves 218 of the sled 108 so to secure the transit case 102 and prevent the sled 108 from sliding out from the transit case 102.

Figure 3:
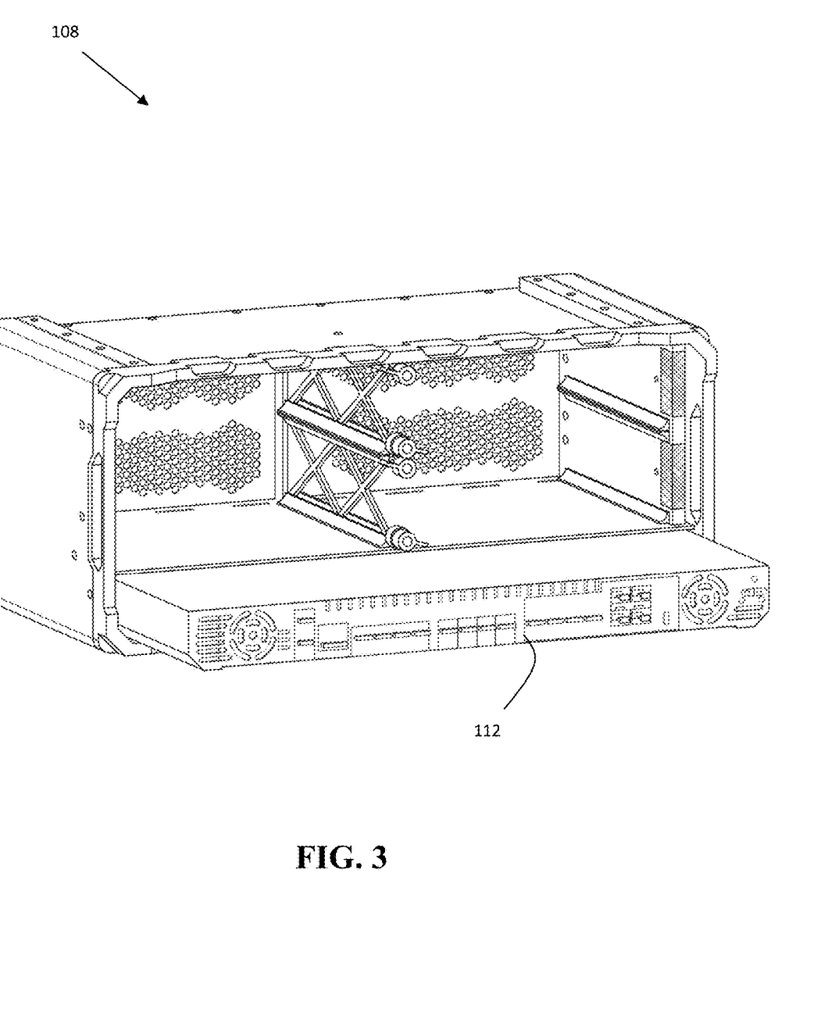
FIG. 3 illustrates an example sled and switch of the TDC of FIG. 1.
Figure 4:
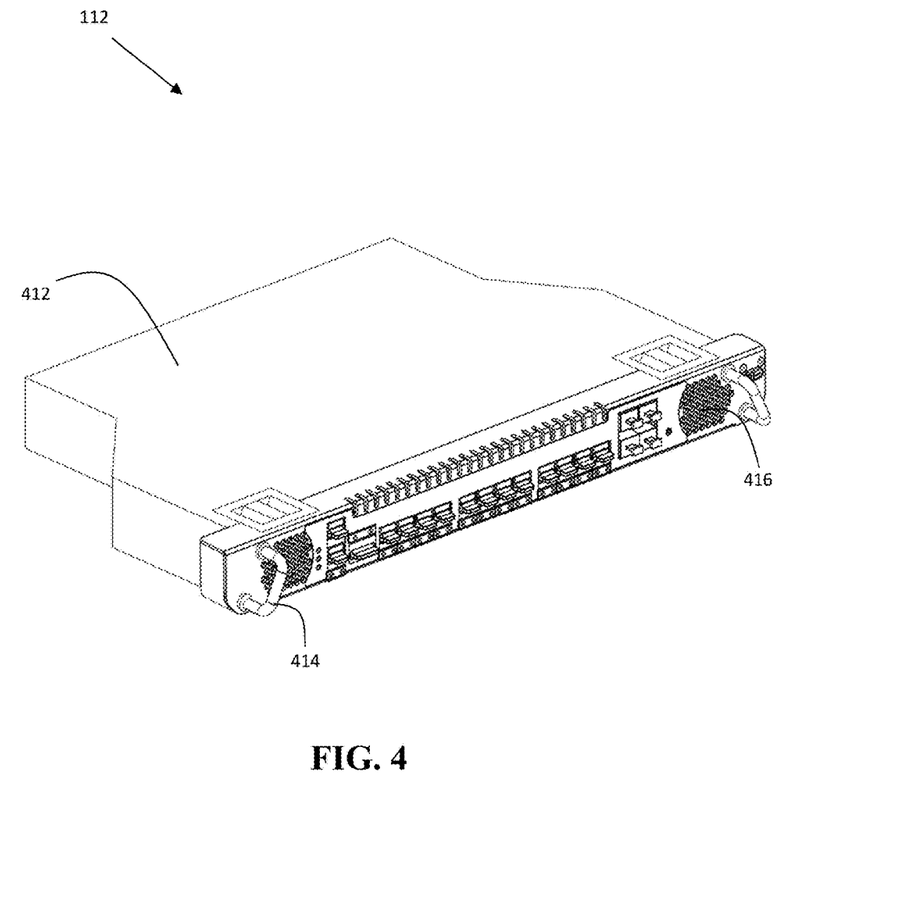
FIG. 4 illustrates an example switch of the TDC of FIG. 1.

As described, the transit case 102 and the sled 108 within are configured to hold computing components. In particular, the TDC system 100 is configured to include a switch 112. FIG. 3 illustrates the switch 112 being inserted into (or being removed from) the sled 108. FIG. 4 illustrates the switch 112 in more detail. The switch 112 is configured to provide computer networking and communications functions for the TDC system 100 to enable communication from remote locations where communication may otherwise not be available.

The switch 112 includes a housing 412 adapted to enable the switch 112 to slide in and out of and to fit securely inside the sled 108. To facilitate sliding in and out of the sled 108, the housing 412 of the switch 112 includes handles 414 on the front side. To help prevent overheating, the housing 412 includes an internal fan (not shown) for circulating air. Air vents 416 located on the front side of the housing 412 further facilitate the cooling of the switch 112.

Figures 5A, 5B:
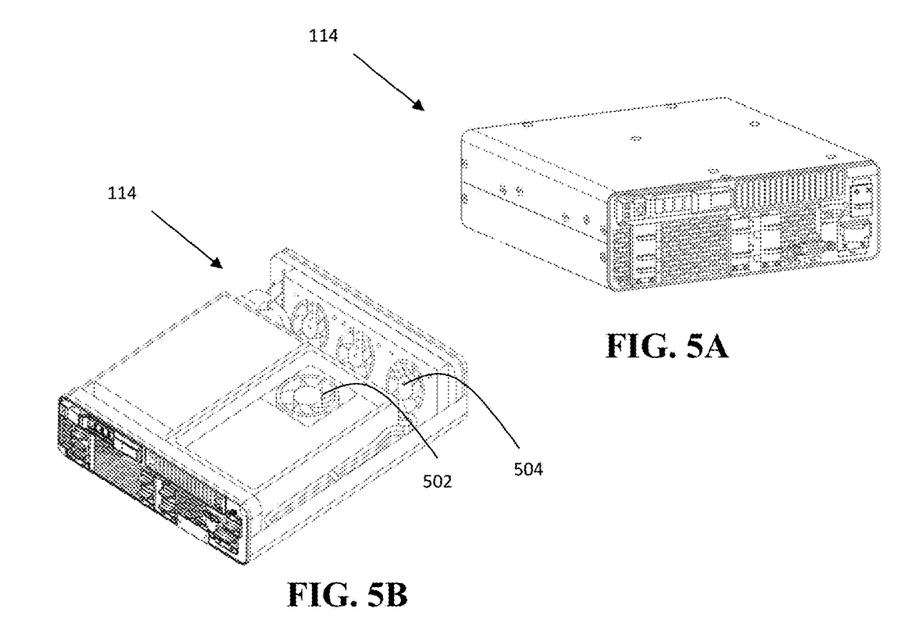
FIG. 5A illustrates an example computing blade of the TDC of FIG. 1.
FIG. 5B illustrates an example computing blade of the TDC of FIG. 1.

Referring back to FIG. 1, the TDC system 100 is further configured to include one or more computing blades 114. It should be appreciated that, although the TDC system 100 is illustrated to include slots for four computing blades, the TDC system 100 may include any suitable number of computing blades. FIG. 5A illustrates an example computing blade 114. The computing blade 114 includes processing capabilities (including multiple core processing), storage, networking capabilities, as well as other capabilities such as VGA graphic support, Web-based IPMI for remote management, and various types of interfaces such as RJ-45, Ethernet, and USB.

Figure 5C:
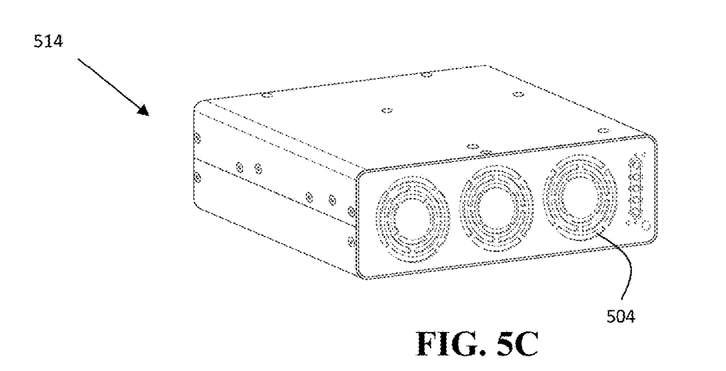
FIG. 5C illustrates an example computing blade of the TDC of FIG. 1.

To help prevent overheating and facilitate cooling, the computing blade 114 includes an internal fan to circulate air inside. FIG. 5B is a view of the computing blade 114 with a portion of the top removed to illustrate the fan 502. The computing blade 114 also includes one or more air vents 504 in the rear to help circulate air. FIG. 5C shows the computing blade 114 from the rear, illustrating the air vents 504 from the outside perspective.

It should be appreciated that since each of multiple computing blades 114 their own internal cooling mechanisms, packing more computing capabilities into the TDC system 100 is possible.

In one example, the computing blade 114 further includes a removable storage device (not shown) that serves as an ignition key. For example, in order to increase security and prevent unauthorized access, the computing blade 114, and in turn the TDC system 110 won't operate unless the removable storage device is first inserted. In one example, the removable storage device is further configured to store configuration settings for the TDC system 110. In one example, the removable storage device is configured to store and run a hypervisor.

Figure 6:
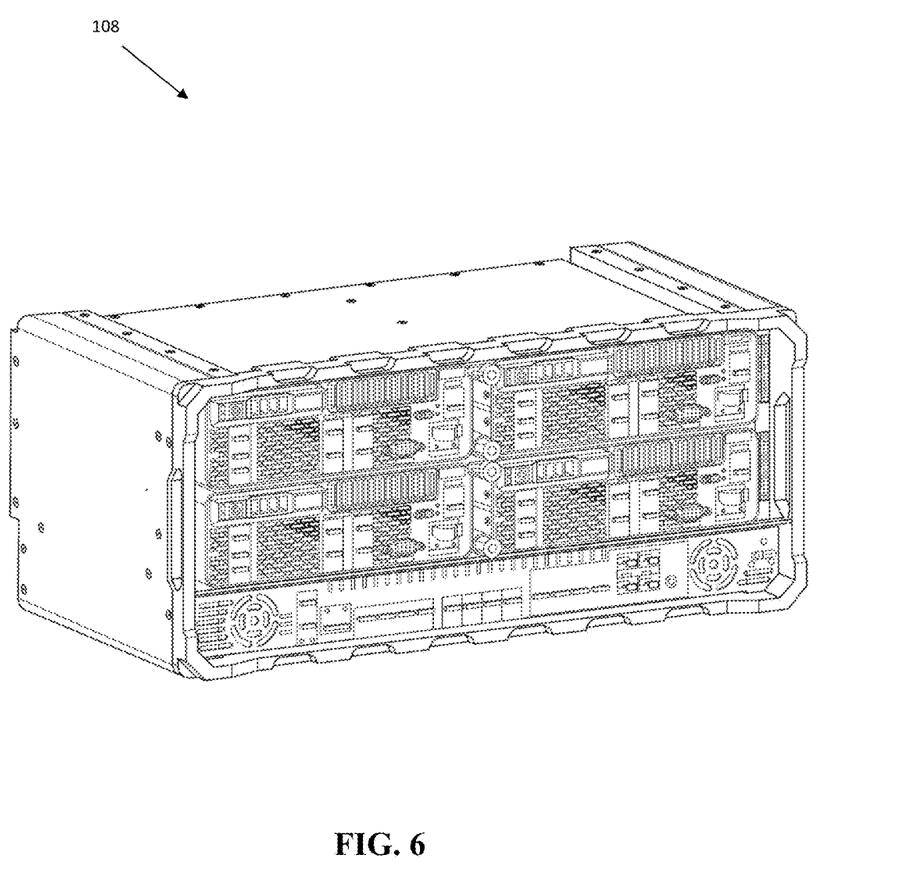
FIG. 6 illustrates an example sled, blade, and switch of the TDC of FIG. 1.

FIG. 6 illustrates the sled 108, including both the blades 114 and the switch 112 inserted, removed from the transit case 102.

Figure 7A:
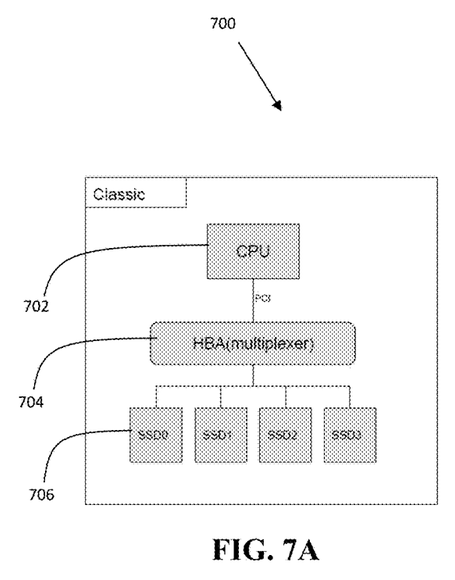
FIG. 7A illustrates a block diagram of a known computing blade.
Figure 7B:
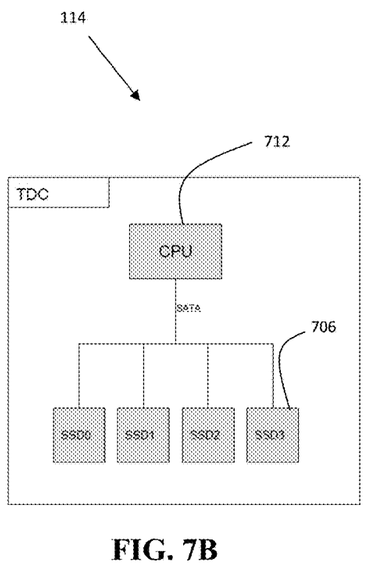
FIG. 7B illustrates a block diagram of a computing blade of the TDC of FIG. 1

It should be appreciated that, in a classical approach to interfacing multiple solid state drives ("SSD") 706 with a CPU 702, as illustrated in FIG. 7A, a host bus adapter or hardware multiplexer is required. It should be appreciated however that, in order to reduce the power consumption and free up space inside the computing blade 114, the hardware multiplexer 704 has been removed. Instead, the CPU 712 of the computing blade 114 is configured to interface directly with the SSDs 706, thus providing for a blade 114 that has power, weight, and size advantages over a classical approach. In particular, an advanced host controller interface ("AHCI"), or software multiplexer, built into the CPU 712 is leveraged to interface directly with the SSDs 706, thus eliminating the need for an external bridge such as a hardware multiplexer.

Common software operating systems used for multiple SSDs across multiple CPUs, such as Nutanix, expect a multiplexer however. Thus, in order to eliminate the need for a host bus adapter or hardware multiplexer and instead rely on the software multiplexer of the CPU, the main operating system, such as a hypervisor, is installed on a removable storage device and controls the hardware of the blade 114. A guest operating system, such as Nutanix, is installed on the removable storage device as well and the CPU 712 passes the software multiplexer to the guest operating system. Thus, the guest operating system now has direct access to the software multiplexer. Accordingly, the host bus adapter or hardware multiplexer can be removed.

To the extent that the term "includes" or "including" is used in the specification or the claims, it is intended to be inclusive in a manner similar to the term "comprising" as that term is interpreted when employed as a transitional word in a claim. Furthermore, to the extent that the term "or" is employed (e.g., A or B) it is intended to mean "A or B or both." When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995). Also, to the extent that the terms "in" or "into" are used in the specification or the claims, it is intended to additionally mean "on" or "onto." Furthermore, to the extent the term "connect" is used in the specification or claims, it is intended to mean not only "directly connected to," but also "indirectly connected to" such as connected through another component or components.

While the present application has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. Therefore, the application, in its broader aspects, is not limited to the specific details, the representative apparatus and method, and illustrative examples shown and described. Accordingly, departures may be made from such details without departing from the spirit or scope of the applicant's general inventive concept.

What is claimed:

1. A portable computing system comprising:
    a transit case for providing structure for the portable computing system, comprising a power supply for providing power to the portable computing system;
    a slidably removable sled disposed inside the transit case, configured to hold a plurality of computing components and to enable access to the plurality of computing components, the slidable removable sled comprising:
        a top chamber configured to hold a first type of computing device, the top chamber comprising a plurality of dividers, wherein at least one of the plurality of dividers comprises a knob having a protruding arm, the knob configured to rotate into a position such that the protruding arm secures at least one of a plurality of computing blades in place;
        a bottom chamber configured to hold a second type of computing device; and
        a floor disposed between the top chamber and a bottom chamber;
    a switch, disposed in the bottom chamber, to provide computer networking and communications functions; and
    the plurality of computing blades, disposed in the top chamber, to provide computing capabilities, wherein each of the plurality of computing blades comprises a central processing unit ("CPU") comprising a software multiplexer for interfacing directly with a plurality of solid state drives ("SSDs").

2. The portable computing system of claim 1, wherein one of the computing blades comprises a removable storage device, a main operating system installed on the removable storage device and configured to control the computing blade hardware, and a guest operating system installed on removable storage device and configured to receive the software multiplexer passed from CPU, thereby enabling the guest operating system to have direct access to the software multiplexer.

3. The portable computing system of claim 2, wherein the removable storage device serves as an ignition key, preventing operation of the computing blade without the removable storage device being inserted.

4. The portable computing system of claim 1, wherein the transit case comprises a wheel disposed on a first end and a retractable handle disposed on a second end, opposite the first end.

5. The portable computing system of claim 1, wherein the sled is rack mountable.

6. The portable computing system of claim 1, wherein the top chamber comprises a plurality of sub-chambers defined by the plurality of dividers.

7. The portable computing system of claim 1, wherein the location of the floor is adjustable, thereby facilitating reconfiguration of the sled.

8. The portable computing system of claim 1, wherein the sled comprises at least one groove disposed along an outer portion, and wherein the transit case comprises at least one knob disposed along an outer portion in alignment with the at least one groove, wherein the knob comprises a protruding arm and is configured to rotate into a position such that the protruding arm engages the at least one groove so to secure the transit case.

9. The portable computing system of claim 1, wherein the switch comprises a housing adapted to enable the switch to slide in and out of and to fit securely inside the sled.

10. The portable computing system of claim 9, wherein the housing comprises a handle for facilitating sliding.

11. The portable computing system of claim 1, wherein the switch comprises an internal fan and at least one air vent for facilitating circulation of air inside the switch.

12. The portable computing system of 1, wherein the plurality of computing blades each comprise an internal fan and at least one air vent for facilitating circulation of air inside each of the computing blades respectively.

13. A portable computing system comprising:
a transit case for providing structure for the portable computing system, comprising a power supply for providing power to the portable computing system;
a slidably removable sled disposed inside the transit case, configured to hold a plurality of computing components and to enable access to the plurality of computing components, the slidable removable sled comprising:
   a top chamber configured to hold a first type of computing device;
   a bottom chamber configured to hold a second type of computing device;
   a floor disposed between the top chamber and a bottom chamber; and
   at least one groove disposed along an outer portion;
a switch, disposed in the bottom chamber, to provide computer networking and communications functions; and
a plurality of computing blades, disposed in the top chamber, to provide computing capabilities, wherein each of the plurality of computing blades comprises a central processing unit ("CPU") comprising a software multiplexer for interfacing directly with a plurality of solid state drives ("SSDs");
wherein the transit case further comprises at least one knob disposed along an outer portion in alignment with the at least one groove of the sled, wherein the knob comprises a protruding arm and is configured to rotate into a position such that the protruding arm engages the at least one groove to secure the transit case.

14. The portable computing system of claim 13, wherein one of the computing blades comprises a removable storage device, a main operating system installed on the removable storage device and configured to control the computing blade hardware, and a guest operating system installed on removable storage device and configured to receive the software multiplexer passed from CPU, thereby enabling the guest operating system to have direct access to the software multiplexer.

15. The portable computing system of claim 14, wherein the removable storage device serves as an ignition key, preventing operation of the computing blade without the removable storage device being inserted.

16. The portable computing system of claim 13, wherein the transit case comprises a wheel disposed on a first end and a retractable handle disposed on a second end, opposite the first end.

17. The portable computing system of claim 13, wherein the sled is rack mountable.

18. The portable computing system of claim 13, wherein the switch comprises a housing adapted to enable the switch to slide in and out of and to fit securely inside the sled.

* * * * *